United States Patent
D'Anna

(10) Patent No.: US 6,271,552 B1
(45) Date of Patent: Aug. 7, 2001

(54) LATERAL RF MOS DEVICE WITH IMPROVED BREAKDOWN VOLTAGE

(75) Inventor: Pablo Eugenio D'Anna, Los Altos, CA (US)

(73) Assignee: Xemod, INC, Sunnyvale, CA (US)

( * ) Notice: Subject to any disclaimer, the term of this patent is extended or adjusted under 35 U.S.C. 154(b) by 0 days.

(21) Appl. No.: 09/413,912

(22) Filed: Oct. 4, 1999

(51) Int. Cl.[7] .......................... H01L 31/113; H01L 29/94

(52) U.S. Cl. ........................ 257/288; 257/408; 257/491

(58) Field of Search ........................ 257/288, 491–94, 257/336, 344, 408

(56) References Cited

U.S. PATENT DOCUMENTS 6,034,415 * 3/2000 Johnson et al. .................... 257/621
6,153,916 * 11/2000 Roth et al. ......................... 257/409

* cited by examiner

*Primary Examiner*—Minh Loan Tran
*Assistant Examiner*—Thomas Dickey
(74) *Attorney, Agent, or Firm*—Boris G. Tankhilevich

(57) ABSTRACT

The lateral RF MOS device having two drain drift regions and a conductive plug source connection structure is disclosed. The usage of two drain drift regions results in the increased source-drain breakdown voltage and in increased maximum drain current density. The lateral RF MOS device of the present intention can be used for high power and high frequency applications.

10 Claims, 5 Drawing Sheets

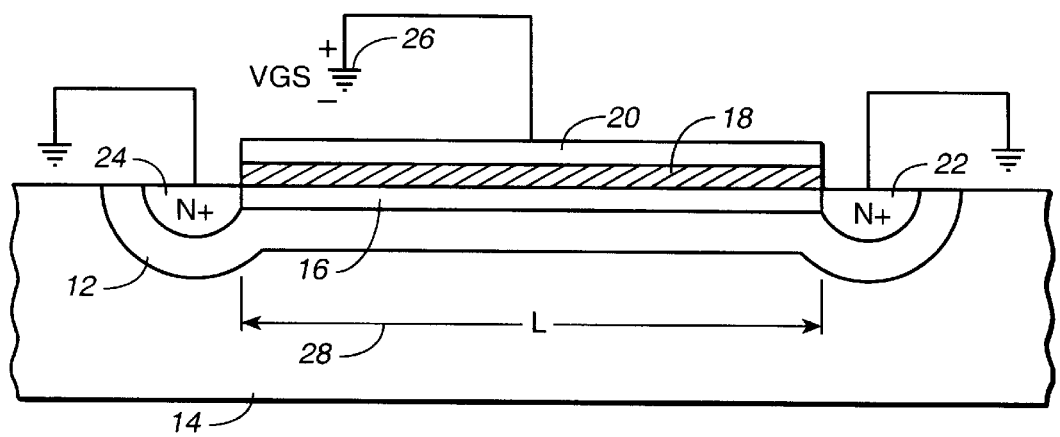
FIG._1A (PRIOR ART)
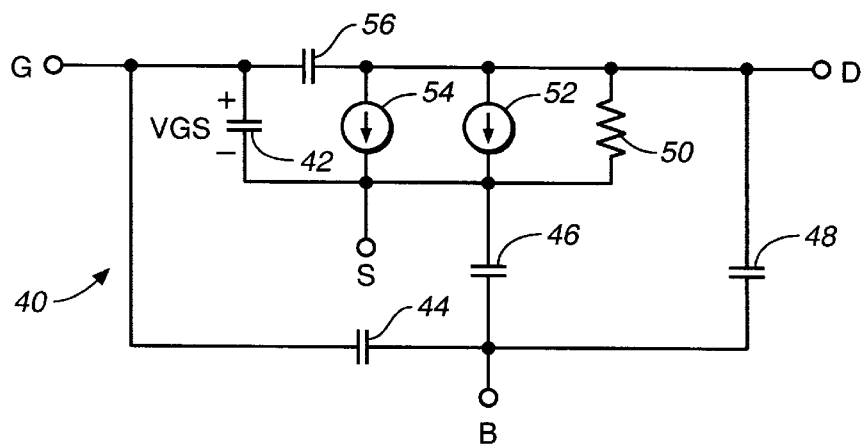
FIG._1B
(PRIOR ART)
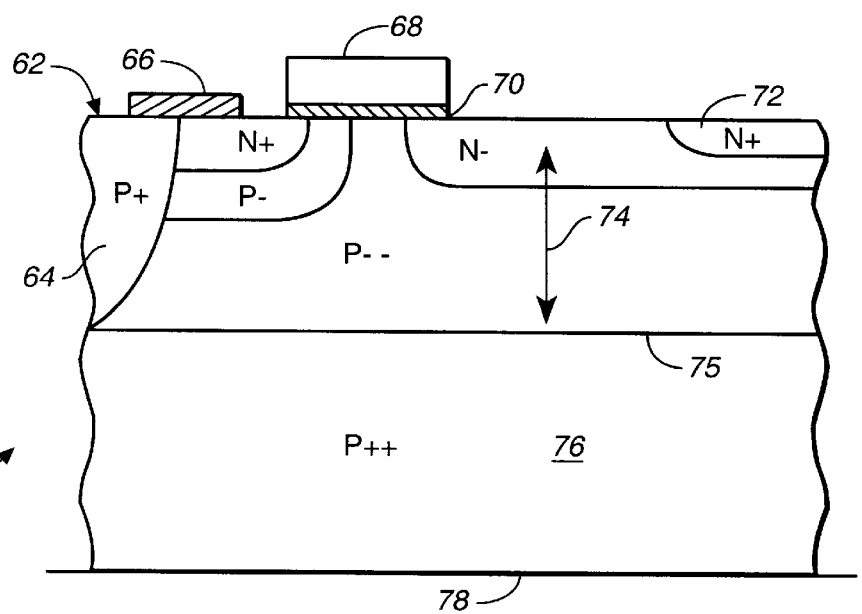
FIG._1C
(PRIOR ART)

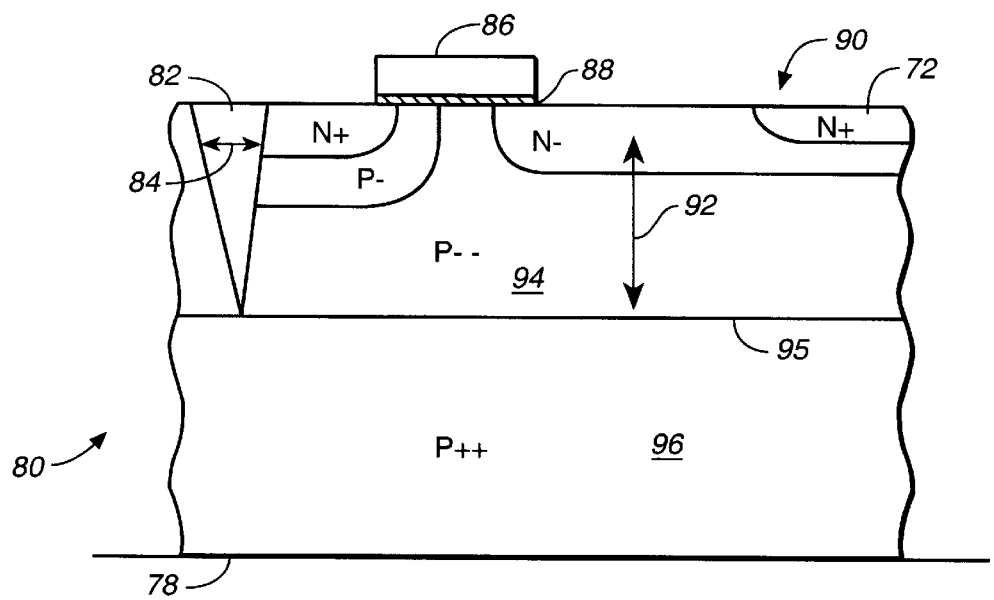
FIG._1D (PRIOR ART)
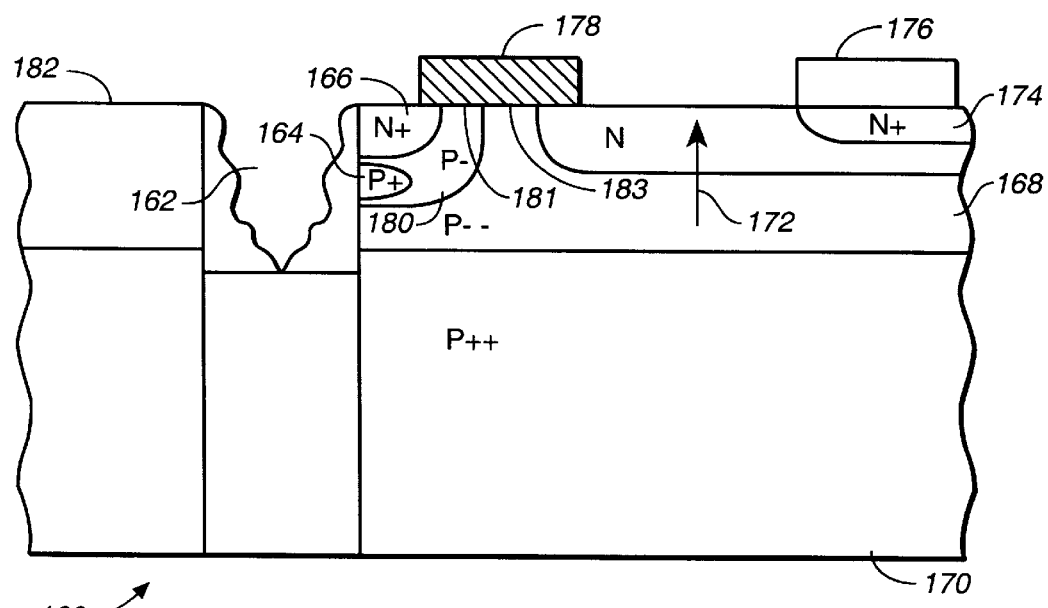
FIG._1E (PRIOR ART)

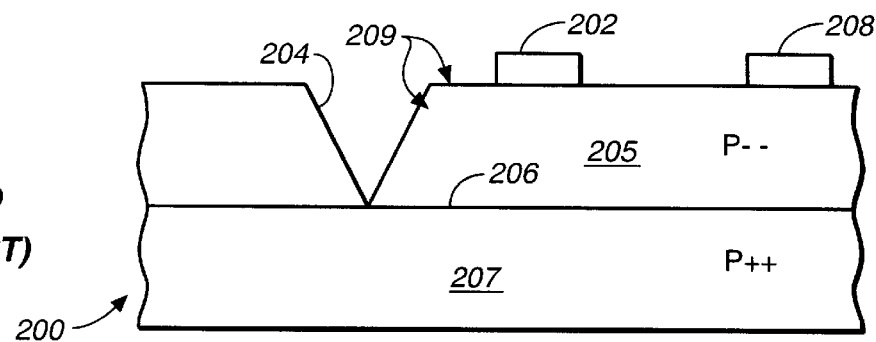
FIG._2
(PRIOR ART)
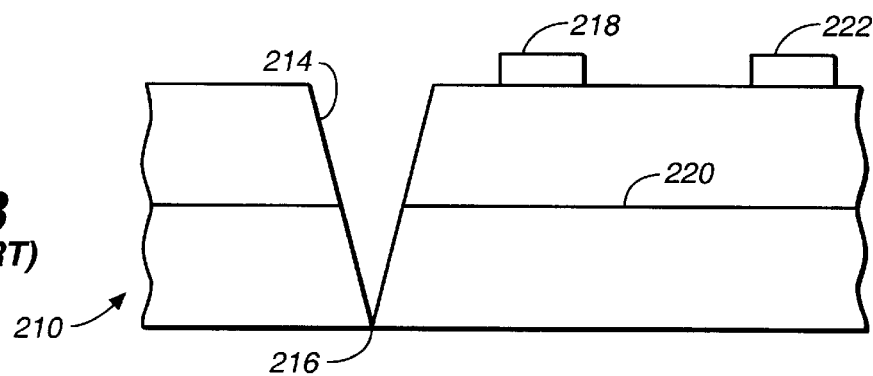
FIG._3
(PRIOR ART)
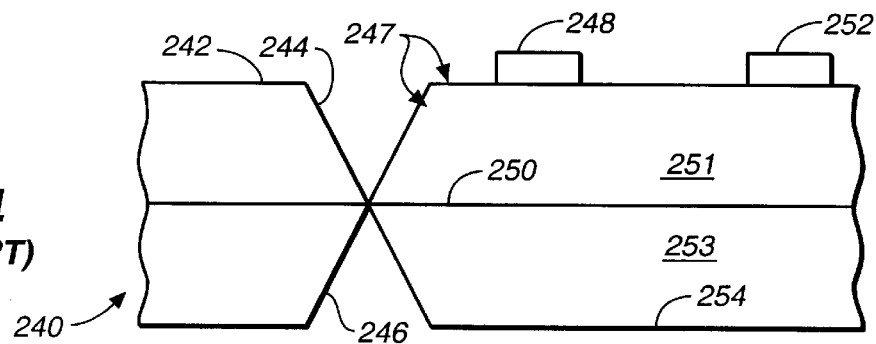
FIG._4
(PRIOR ART)

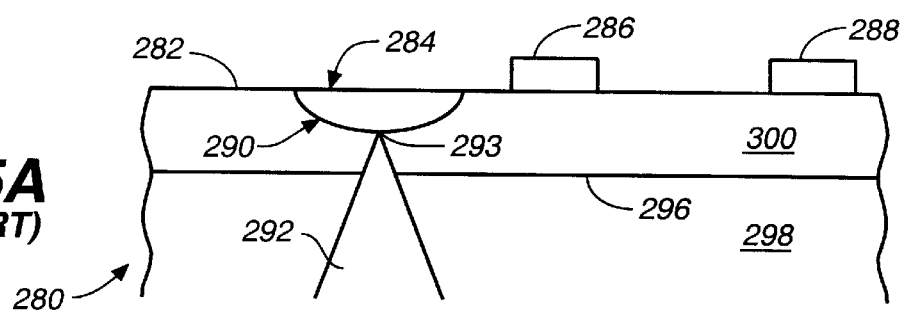
FIG._5A
(PRIOR ART)
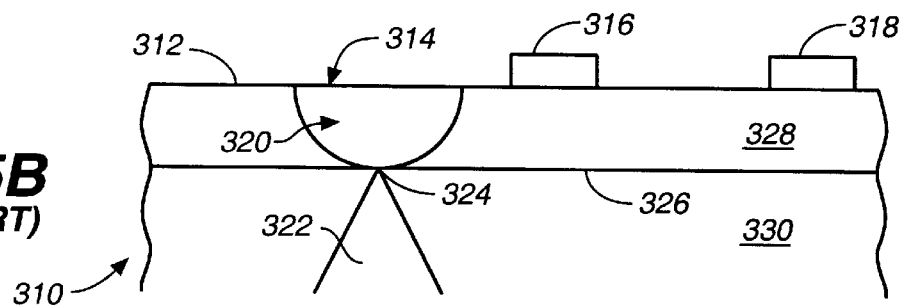
FIG._5B
(PRIOR ART)

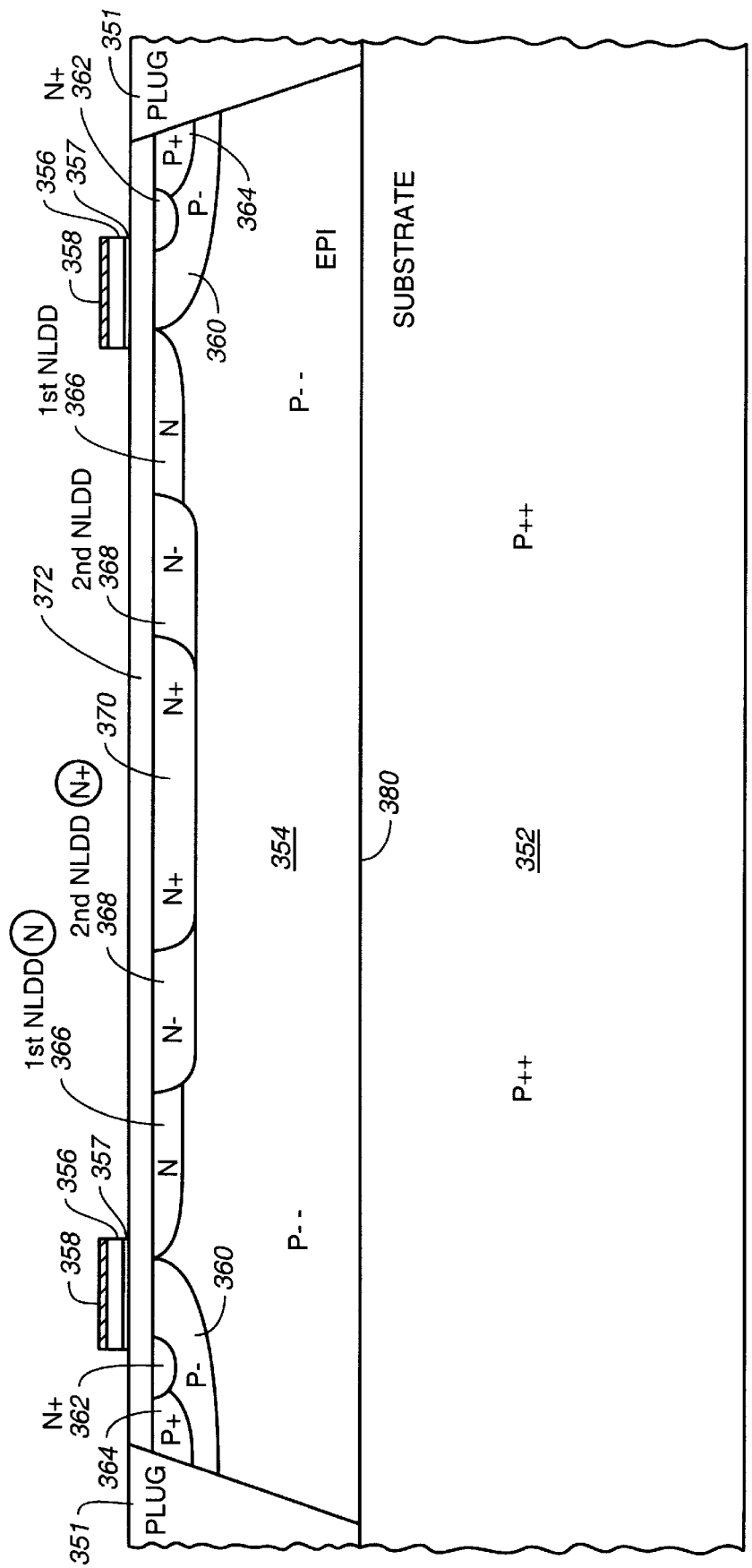
FIG._6

LATERAL RF MOS DEVICE WITH IMPROVED BREAKDOWN VOLTAGE

FIELD OF THE INVENTION

The current invention is in the field of lateral RF MOS devices.

DESCRIPTION OF THE BACKGROUND ART

Power high frequency devices have been built using a variety of semiconductor technologies. For a long time the preferred vehicle for their realization has been the NPN bipolar junction transistor (BJT). Its primary advantage was the achievable high intrinsic transconductance ($g_m$) that permitted the fabrication of high power devices utilizing small silicon areas.

As processing technology improved, in the early 1970's a number of MOSFET vertical structures begun to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the continuous quest for high frequency operation at high power the MOSFET structure has displaced the BJT since the early 1970's in applications where its performance has been competitive.

Recently, new prior art RF MOS devices have been placed on the market by several vendors. The new prior art RF MOS devices utilize the standard lateral MOS device with a diffused via that connects the source to the backside of the chip such that the back side becomes both electrical and thermal ground. The prior art structure also uses a polysilicide gate process as a compromise between the fabrication benefits of the self aligned polysilicon gate and the high frequency performance of the metal gate structure. The prior art structure has extended the frequency of operation of MOS devices into the 2 GHz region thus covering two frequency bands of great commercial importance: the cellular and PCS/PCN mobile telephone bands.

The via backside contact design and the polysilicide gate processing technology have allowed the prior art device to attain its performance. Firstly, by transferring the source connection to the backside of the chip through a diffused via, the packaging of the device has been simplified reducing parasitic inductance and resistance to ground. The thermal dissipation has been also improved because an electrical isolation layer in the package has been removed. Secondly, the output capacitance of RF MOS device for the common-source mode of amplification operation has been made comparable to the output capacitance obtained with BJT structures. This results in improved collector efficiency and in wider usable bandwidth (BW) of the RF MOS device operating as an amplifier. This improvement comes about as the lateral RF MOS device at high drain-source applied bias has a lower drain-source capacitance ($C_{ds}$) than the drain-source capacitance of the prior art RF MOS devices. Finally, the use of polysilicide allows the efficient feeding of long gate fingers.

The design of the existing lateral RF MOS devices was further improved in the lateral RF MOS device disclosed in the U. S. Pat. No. 5,949,104, issued on Sep. 7, 1999 and incorporated by reference herein in its entirety. In the '104 patent the connection from the source to the backside of the silicon substrate was improved by using a metal plug. The usage of the metal plug to connect the source to the backside of the silicon substrate further reduced the space needed for that connection, and eliminated the lateral as well as the downward movement of the source to backside via diffusion. The metal plug design allowed the inclusion of more usable device active area per unit chip area, lead to an increase of available device output power per unity chip area, resulted in a further decrement of the minimal value of the drain-source capacitance ($C_{ds}$), and in a wider usable BW of the device operating as an amplifier.

However, all prior art lateral RF MOS devices had an inadequate maximum drain-source voltage breakdown due to a high electric field concentration near the drain junction. The increased breakdown voltage would allow higher current density to flow in the source-drain channel thus increasing the power output that could be available at the lateral RF MOS device of the same size.

Thus, what is needed is to improve the design of a lateral RF MOS device which would lead to a lateral RF MOS device having the prior art size but a larger power output.

SUMMARY OF THE INVENTION

To address the shortcomings of the available art, the present invention provides for a large power output lateral RF MOS device with the prior art size.

One aspect of the present invention is directed to a lateral MOS structure having two enhanced drain drift regions.

In the first preferred embodiment, the lateral MOS structure comprises a semiconductor material of a P-type having a first dopant concentration P⁻ and a top surface. A conductive gate overlies the top surface of the semiconductor material and is insulated from it. A first region of a second conductivity type and having a second dopant concentration is formed completely within the semiconductor material of the first conductivity type. The first region forms a first enhanced drain drift region of the RF MOS transistor structure. The lateral MOS structure further comprises a second region of the second conductivity type and having a third dopant concentration being less than the second dopant concentration formed in the semiconductor material. The second region forms a second enhanced drain drift region of the RF MOS transistor. The second enhanced drain drift region contacts the first enhanced drain drift region.

The lateral MOS structure further comprises a drain region contacting the second enhanced drain drift region, a body region having a first end underlying the conductive gate, a source region located within the body region, a contact enhancement region located within the body region, and a conductive plug region formed in the source region and the body region of the semiconductor material.

In one embodiment, the conductive plug region connects the source region and the body region of the semiconductor material to the backside of the MOS structure.

In another embodiment, the conductive plug region connects a surface of the source region and a lateral surface of the body region of the semiconductor material to a highly conductive substrate of the lateral MOS structure.

In the second preferred embodiment of the present invention, the lateral MOS structure comprises a semiconductor material of a P-type having a first dopant concentration P⁻ and a top surface. A conductive gate overlies the top surface of the semiconductor material and is insulated from it. A first region of a second conductivity type and having a second dopant concentration is formed completely within the semiconductor material of the first conductivity type. The first region forms a first enhanced drain drift region of the RF MOS transistor structure. The lateral MOS structure further comprises a second region of the second conductivity type and having a third dopant concentration being higher than the second dopant concentration formed in the semiconductor material. The second region forms a second enhanced drain drift region of the RF MOS transistor. The second enhanced drain drift region contacts the first enhanced drain drift region.

The lateral MOS structure further comprises a drain region contacting the second enhanced drain drift region, a body region having a first end underlying the conductive gate, a source region located within the body region, a contact enhancement region located within the body region, a contact region contacting the body region, and a conductive plug region connecting the contact region and a backside of the semiconductor material.

In one embodiment, the contact region further connects the top surface of the semiconductor material to the highly conductive substrate.

In another embodiment, the contact region is located within the semiconductor material.

In the preferred embodiment, the first conductivity type is of P type.

In one embodiment of the lateral MOS structure, the dopant concentration of the second enhanced drain drift region $N_2$ is 3/2 as much as the dopant concentration of the first enhanced drain drift $N_1$.

The conductive plug can comprise: a metal plug, or a silicided plug. The silicided metal plug can comprise: a tungsten silicided plug, a titanium silicided plug, a cobalt silicided plug, or a platinum silicided plug.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

FIG. 1A shows an idealized NMOS device cross section with depletion and induced channel and with applied positive $V_{GS}$.

FIG. 1B is a small-signal MOS transistor equivalent circuit.

FIG. 1C is an illustration of the prior art structure of lateral RF MOS devices.

FIG. 1D depicts a lateral view of a simplified plug contact structure of a lateral RF MOD transistor.

FIG. 1E depicts a detailed lateral view of the plug contact structure of a lateral RF MOS transistor.

FIG. 2 illustrates a lateral view of a plug contact structure, wherein the conductive plug region connects a top surface and a lateral surface of the source region of the semiconductor material to a highly conductive substrate of the RF MOS structure.

FIG. 3 is a lateral view of the MOS structure, wherein a V-shaped conductive plug region connects a top surface and a lateral surface of the source region of the semiconductor material to a backside of the MOS structure.

FIG. 4 depicts a lateral view of the MOS structure, wherein an X-shaped conductive plug region connects a top surface and a lateral surface of the source region of the semiconductor material to a backside of the MOS structure.

FIG. 5 is a lateral view of the MOS structure, wherein the conductive plug region connects a backside of the semiconductor material to the diffusionally formed source-region of the MOS structure.

FIG. 6 depicts a structure of the lateral RF MOS device of the present invention.

DETAILED DESCRIPTION OF THE PREFERRED AND ALTERNATIVE EMBODIMENTS

An idealized NMOS device cross section with depletion and induced channel and with applied positive $V_{GS}$ is shown in FIG. 1A. For the complete reference, please, see "Analysis and Design of Analog Integrated Circuits" by Paul Gray and Robert Meyer, published by John Wiley & Sons, Inc., 1993.

In the large-signal model of a typical NMOS device, we consider substrate, source, and drain grounded and a positive voltage $V_{GS}$ (between the gate (20) and the substrate (14)) applied to the gate as shown in FIG. 1A. The gate and the substrate form the plates of a capacitor with the layer of silicon oxide ($SiO_2$) (18) as a dielectric. Positive charge accumulates on the gate and negative charge in the substrate. Initially, the negative charge in the P-type substrate is manifested by creation of a depletion region (12) and resulting exclusion of holes under the gate. The depletion-layer width X under the oxide is:

$$X = (2\epsilon\phi/qN_A)^{1/2}; \quad (1)$$

where $\phi$ is the potential in the depletion layer at the oxide-silicon interface, $N_A$ (atoms/cm$^3$) is the doping density (assumed constant) of the p-type substrate, and $\epsilon$ is the permittivity of the silicon. The charge per unit area in his depletion region is $$Q = qN_A X = \sqrt{(2qN_A\epsilon\phi)}. \quad (2)$$

When the potential in the silicon reaches a critical value equal to twice the Fermi level $\phi_f \sim 0.3$ V, a phenomena known as "inversion" occurs. Further increases in gate voltage produce no further changes in the depletion-layer width but instead a thin layer of electrons is induced in the depletion layer directly under the oxide. This produces a continuous n-type region (16) with the source (24) and drain (22) regions and is the conducting channel between source and drain. The channel (16) can be modulated by increases or decreases in the gate voltage. In the presence of an inversion layer, and with no substrate bias, the depletion region contains a fixed charge:

$$Q_{b0} = \sqrt{(2qN_A\epsilon\phi_f)}. \quad (3)$$

If a substrate bias voltage $V_{SB}$ (source is positive for n-channel devices) is applied between source and substrate, the potential required to produce inversion becomes $(2\phi_f + V_{SB})$ and the charge stored in the depletion region in general is:

$$Q_b = \sqrt{(2qN_A\epsilon(2\phi_f + V_{SB}))}. \quad (4)$$

The gate voltage $V_{GS}$, required to produce an inversion layer, is called the threshold voltage $V_t$ and can be calculated as follows. This voltage consists of several components. First, a voltage $[2\phi_f + (Q_b/C_{Ox})]$ is required to sustain the depletion layer charge $Q_b$, where $C_{Ox}$ is the gate oxide capacitance per unit area. Second, a work-function difference $\phi_{ms}$ exists between the gate metal and the silicon. Third, there is always charge density $Q_{ss}$ (positive) in the oxide at the silicon interface. This is caused by crystal discontinuities at the Si—SiO$_2$ interface and must be compensated by a gate voltage contribution of (−) $Q_{ss}/C_{Ox}$. Thus, we have a threshold voltage:

$$V_t = \phi_{ms} + 2\phi_f + (Q_b/C_{Ox}) - Q_{SS}/C_{Ox} = V_{t0} + \gamma(\sqrt{2\phi_f + V_{SB}} - \sqrt{2\phi_f}); \quad (5)$$

where $\gamma = (1/C_{Ox})\sqrt{2qN_A\epsilon}$, $C_{Ox} = \epsilon_{Ox}/t_{Ox}$, and $\epsilon_{Ox}$ and $t_{Ox}$ are the permittivity and thickness of the oxide, respectively.

The preceding large-signal equations can be used to derive the small-signal model of the MOS transistor in the saturation or pinch-off region. The source-substrate voltage $V_{BS}$ affects threshold voltage $V_t$ (eq. 5) and thus the drain current $I_D$. This is due to influence of the substrate acting as a second gate and is called body effect. As a consequence, the drain current $I_D$ is a function of both $V_{GS}$ and $V_{BS}$, and two transconductance generators (54) and (52) are needed in the small-signal model (40) as shown in FIG. 1B. Variations in voltage $v_{bs}$ from source to body cause current $g_{mb}v_{bs}$ to flow from drain to source. The substrate of this idealized lateral MOS device is the area that we call "body region" in the lateral RF MOS device and is always connected to the most negative supply voltage and is thus an ac ground. Thus, in the present embodiments the "body" effect has no role.

Parasitic resistances due to the channel contact regions should be included in series with the source and drain of the model. These resistances have an inverse dependence on channel width W and have typical values of 50 to 100 Ω for devices with W of about 1 $\mu$.

The parameters of the small signal model (40) of FIG 1B can be determined from the I–V characteristics of the NMOS device. For voltages between drain and substrate $V_{DS}$ low in comparison with the Early voltage $V_A$, the transconductance $g_m$ is:

$$g_m = \sqrt{2k'(W/L)I_D}; \quad (6)$$

where $k' = \mu_n C_{Ox}$, $\mu_n$ is the average electron mobility in the channel, L and W are the length and the width of the channel. Thus, like the JFET and unlike the bipolar transistor, the transconductance of the MOS depends on both bias current and the W/L ratio (and also on the oxide thickness via k').

Similarly, the transconductance $g_{mb}$ (52) can be expressed as follows:

$$g_{mb} = [\gamma\sqrt{2k'(W/L)I_D}/(\sqrt{2(2\phi_f + V_{SB})})]. \quad (7)$$

The small-signal output resistance $r_0$ (50) can be expressed as follows:

$$r_0 = (\partial I_D/\partial V_{DS})^{-1} = (V_A/I_D). \quad (8)$$

The gate-source capacitance $C_{gs}$ (42) of FIG. 1B is intrinsic to the device operation in the saturation region. On the other hand, the substrate-source capacitance $C_{sb}$ (46) is shorted by a metal finger or by the source plug in the prior art device, and the drain-source capacitance $C_{db}$ (48) is a parasitic depletion-region capacitance equal to the drain-source $C_{ds}$ capacitance. Therefore, for the lateral RF MOS structure:

$$C_{sb} = 0; \quad (9)$$

and $$C_{db} = C_{db0}/(\sqrt{(1+V_{DB}/\phi_0)}) = C_{ds0}/(\sqrt{(1+V_{DB}/\phi_0)}) = C_{ds}. \quad (10)$$

The high frequency gain of the lateral RF MOS device is controlled by the capacitance elements in the equivalent circuit. The frequency capability of the lateral RF MOS device is most often specified in practice by determining the frequency where the magnitude of the short-circuit, common gate current gain falls to unity. This is called the transition frequency, $f_T$, and is a measure of the maximum useful frequency of the transistor when it is used as an amplifier. The $f_T$ of the lateral RF MOS is given by:

$$f_T = (1/2\pi)g_m/(C_{gs} + C_{gd}). \quad (11)$$

The prior art structure (60) depicted in FIG. 1C illustrates one technique to make a connection of the source and body regions in the MOS structure to the backside (78) through the diffusion of a dopant (64) introduced from the topside (62) of the chip and a metal finger short. However, this diffusion not only moves the topside dopant (64) down and sideways but also moves the substrate dopant (76) up thus reducing the distance between the highly doped substrate interface (75) and the drain area (72) of the device. This diffusion movement of the interface (75) produces an increase of the minimum source-drain capacitance $C_{ds}$ that can be obtained under a high voltage bias $V_{DS}$.

In another prior art structure (80) depicted in FIG. 1D, the plug (82) connects the source and the body areas to the backside (95) through the original epitaxial layer (94) thickness without diffusion. The connection area (84 of FIG. 1D) was made small comparable to the diffusion area (66 of FIG. 1C) to increase the density of devices per inch$^2$. The usage of a metal plug (82 of FIG. 1D) provided for a good ohmic contact in a small area (2) without long thermal processing cycles.

The detailed prior art source-body connection structure (160) for lateral RF MOS devices is shown in FIG. 1E. The structure (160) was optimized in terms of its transconductance $g_m$ and interelectrode capacitances $C_{gs}$, $C_{gd}$, and $C_{ds}$, so that it could be used in high frequency applications, such as the cellular and the PCS regions of the RF spectrum. More specifically, the transconductance per unit $g_m$ of the lateral RF MOS device (160 of FIG. 1E) was increased by fabricating the device with the smallest plug size that the technology would allow. The reduction in $C_{gd}$ capacitance of the device (160 of FIG. 1E) was obtained by minimizing the channel length L and by minimizing the insertion of the drain extension lateral diffusion under the gate. The reduction in $C_{ds}$ capacitance of the device (160 of FIG. 1E) was obtained by utilizing a high resistivity material under the drain portion of the structure (160 of FIG. 1E) and by separating the drain area from the source. A conductive plug region (162) was formed in the source-body region of the semiconductor material.

FIG. 6 depicts a detailed cross-sectional view of the lateral RF MOS transistor (350) of the present invention having two drain drift regions (366 and 368) and a plug source-body-contact structure. The device structure (350) comprises: a semiconductor material comprising an epitaxial layer (354) of a first conductivity type and having an epitaxial layer dopant concentration and a top surface (372).

In one embodiment, the epitaxial layer's conductivity type is P-type, that is the majority carriers are holes. The dopant concentration of the epitaxial layer is P$^-$, wherein (−) indicates that the dopant concentration P$^-$ of holes in the epitaxial layer (354) is small comparatively with the hole concentration P in the body region (360) (see discussion below). The typical dimensions of the epitaxial layer (354) are (3–10)$\mu$.

In another embodiment of the present invention, the semiconductor material (354) is of a second (N) conductivity type, has a dopant concentration N$^-$ and includes a top surface (372). In this embodiment, the majority carriers are electrons.

A conductive gate (356) overlies the top surface (372) of the semiconductor material. The gate (356) is insulated from the semiconductor material by a gate oxide layer (357). The gate oxide layer has the dimensions (200–700)Å.

In one embodiment, the gate comprises a polysilicon gate.

The region (366) forms a first enhanced drain drift region of the RF MOS structure. The region (366) is formed completely within the semiconductor material (354).

In the first preferred embodiment, the first enhanced drain drift region (366) has N conductivity type if the epitaxial layer has P conductivity type.

In the second preferred embodiment, the first enhanced drain drift region (366) has P conductivity type if the epitaxial layer has N conductivity type.

In the first preferred embodiment, the first enhanced drain drift region (366) has N conductivity type and has a dopant concentration $N_1$. The first enhanced drain region (366) has dimensions (0.1–2.5)$\mu$ laterally, and about (0.2–0.5) $\mu$ vertically.

The region (368) forms a second enhanced drain drift region of the RF MOS structure that contacts the first enhanced drain drift region (366). The region (368) is formed completely within the semiconductor material (354).

In the first preferred embodiment, the second enhanced drain drift region (368) has N conductivity type if the epitaxial layer has P conductivity type.

In the second preferred embodiment, the second enhanced drain drift region (368) has P conductivity type if the epitaxial layer has N conductivity type.

In the first preferred embodiment, the second enhanced drain drift region (368) has N conductivity type and has a dopant concentration $N_2$ that is larger than the dopant concentration $N_1$ of the first enhanced drain region (366):

$$N_1 < N_2. \tag{12}$$

The second enhanced drain region (368) has dimensions (0.1–2.5)$\mu$ laterally, and about (0.2–0.5)$\mu$ vertically.

In one embodiment, the dopant concentration $N_2$ of the second enhanced drain drift region (368) is 3/2 as much as the dopant concentration $N_1$ of the first enhanced drain drift region (366):

$$N_2 = 3/2\ N_1 \tag{13}$$

The structure of the lateral RF MOS device (350 of FIG. 6) of the present invention including two drain drift regions (366 and 368) allows one to increase the maximum drain drift current density of the device and the drain-to-source breakdown voltage $V_{breakdown}$ of the structure (350 of FIG. 6) is also increased.

Indeed, the effective electrical field in the drain drift region is strong enough (about 10 kV/cm) to cause at certain critical concentration of carriers $N_c$ the avalanche effect of carrier multiplication. Thus, the critical carrier concentration $N_c$ is related to the breakdown voltage $V_{breakdown}$, that is defined as the voltage at which the avalanche effect of carrier multiplication takes place.

According to (eq. 12), the second drain drift region (368 of FIG. 6) has the concentration $N_2$ that is higher than the concentration of the first drain drift region $N_1$. This results in the redistribution of the critical electrical fields in the source-drain channel and in increase of the drain-to-source breakdown voltage $V_{breakdown}$. The maximum current density in the source-drain channel of the device is increased because the total concentration:

$$N_T = N_1 + N_2 \tag{14}$$

in the drain drift region is increased.

Referring back to the structure (350 of FIG. 6) of the RF MOS device of the present invention, a drain region (370) is also formed in the semiconductor material (354).

In one embodiment, the drain region (370) has the N conductivity type, if the epitaxial layer (354) has P conductivity type.

In another embodiment, the drain region (370) has the N conductivity type, if the epitaxial layer (354) has P conductivity type.

If the drain region (370) is of N conductivity type, the drain region (370) has a dopant concentration $N^+$ that is greater than the dopant concentration $N_1$ of the first enhanced region (366), and greater than the dopant concentration $N_2$ of the second enhanced region (368). The drain region (370) contacts the second enhanced drain drift region (368). The typical dimensions of the drain region (370) are (0.5–3.0)$\mu$ horizontally, and (0.1–0.3)$\mu$ vertically.

A body region of the RF MOS structure (360 of FIG. 6) is also formed in the semiconductor material.

In one embodiment, the body region (360) has P conductivity type if the epitaxial layer (354) has P conductivity type.

In another embodiment, the body region (360) has N conductivity type if the epitaxial layer (354) has N conductivity type.

In the P conductivity type embodiment, the body region (360) has a dopant concentration $P^-$ that is equal or greater than the dopant concentration $P^-$ of the epitaxial layer (354). The typical dimensions of the body region (360) are (0.5–1.5) $\mu$ horizontally or vertically.

The body region (360) includes a source region (362) being of N conductivity type N (if the epitaxial layer has P conductivity type and vice versa) and having a dopant concentration $N^+$. The typical dimensions of the source region (362) are (0.5–1.5)$\mu$ horizontally.

The body region (360) also includes a body contact region (364) being of P conductivity type (if the epitaxial layer has P conductivity type and vice versa) and having a dopant concentration $P^+$ that is greater than the dopant concentration $P^-$ of the body region (360). The typical dimensions of the region (364) are (0.5–1.0) $\mu$ vertically or horizontally.

In one embodiment, the lateral RF MOS device (360 of FIG. 6) also includes a conductive plug region (351) formed in the contact enhancement region (364) and the body region (360) of the semiconductor material.

The conductive plug (351 of FIG. 6) can comprise a metal plug or a silicided plug. The silicided plug can comprise a tungsten silicided plug, a titanium silicided plug, a cobalt silicided plug, or a platinum silicided plug.

In the first preferred embodiment of the present invention, including the prior art structure (200 of FIG. 2), the conductive plug region (204 of FIG. 2 or 351 of FIG. 6) connects the contact enhancement region (364 of FIG. 6) and the body region (360 of FIG. 6) to an interface (206) between a highly conductive substrate (207) of the RF MOS structure and an epitaxial layer (205).

In another embodiment of the present invention, including the prior art structure (210 of FIG. 3), the conductive plug region (214 of FIG. 3 or 351 of FIG. 6) connects the contact enhancement region (364 of FIG. 6) and the body region (360 of FIG. 6) to a highly conductive substrate (216) of the RF MOS structure (210).

Yet in one more embodiment of the present invention, including the prior art structure (240 of FIG. 4), the conductive plug region comprises two elements (244) and (246). The element (244) of the plug connects a top of the source region and a lateral surface (247) of the body contact region to an interface (250) between a highly conductive substrate (254) of the RF MOS structure and an epitaxial layer (251). The element (246) connects the backside (254) of the substrate (253) with the interface (250) between the substrate (253) of the RF MOS structure and the epitaxial layer (251).

In another preferred embodiment of the present invention including the prior art structure depicted in FIGS. 5A and 5B, a contact region of the lateral RF MOS transistor structure is formed in the semiconductor material (290 of FIG. 5A and 320 of FIG. 5B).

Yet in one more embodiment, illustrated as structure (240 of FIG. 4), the conductive plug region comprises two elements (244) and (246). The element (244) of the plug connects a top of the source region and a lateral surface (247) of the body contact region to an interface (250) between a highly conductive substrate (254) of the RF MOS structure and an epitaxial layer (251). The element (246) connects the backside (254) of the substrate (253) with the interface (250) between the substrate (253) of the RF MOS structure and the epitaxial layer (251).

In another preferred embodiment of the present invention, a contact region of the lateral RF MOS transistor structure is formed in the semiconductor material (290 of FIG. 5A and 320 of FIG. 5B).

In this embodiment, the lateral RF MOS device of the present invention also includes a prior art structure including a conductive plug region (292 of FIG. 5A or 322 of FIG. 5B) formed in the semiconductor material.

In one embodiment, the source region has a P conductivity type and a dopant concentration P greater than the dopant concentration P$^-$ of the body region (360).

In one embodiment of the present invention including the prior art structure depicted in FIG. 5A, the diffusion contact region (290 of FIG. 5A) is formed completely within the semiconductor material (300) of the RF MOS structure. The conductive plug region (292) connects a backside (298) of the substrate to the diffusion region (290).

In another embodiment of the present invention including the prior art structure depicted in FIG. 5B, the diffusion contact region (320 of FIG. 5B) connects the top and side surfaces (312) of the RF MOS structure (310) to an interface (324) between the highly conductive substrate (330) and the epitaxial layer (328). The conductive plug region (322) connects a backside (330) of the substrate to the diffusion region (320) formed in the semiconductor material (328) of the RF MOS structure.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A lateral RF MOS transistor comprising:
   a semiconductor material of a first conductivity type, said semiconductor material having a first dopant concentration and a top surface;
   a conductive gate overlying and insulated from said top surface of said semiconductor material;
   a first region formed completely within said semiconductor material of said first conductivity type, said first region being of a second conductivity type and having a second dopant concentration to form a first enhanced drain drift region of said RF MOS transistor structure;
   a second region formed in said semiconductor material, said second region being of said second conductivity type and having a third dopant concentration to form a second enhanced drain drift region of said RF MOS transistor, said second region contacting said first region, said third dopant concentration being less than said second dopant concentration;
   a third region formed in said semiconductor material, said third region being of said second conductivity type and having a fourth dopant concentration greater than said second dopant concentration to form a drain region of said RF MOS transistor, said third region contacting said second region;
   a fourth region formed in said semiconductor material, said fourth region being of said first conductivity type and having a fifth dopant concentration to form a body region of said RF MOS transistor structure, said fifth dopant concentration being equal or greater than said first dopant concentration, said fourth region having a first end underlying said conductive gate, any remaining portion of said semiconductor material underlying said gate being of said first conductivity type;
   a fifth region formed in said semiconductor material, said fifth region being of said second conductivity type and having a sixth dopant concentration to form a source region of said RF MOS transistor structure, said fifth region being located within said fourth region;
   a sixth region formed in said semiconductor material, said sixth region being of said first conductivity type and having a seventh dopant concentration to form a contact enhancement region of said RF MOS transistor structure, said seventh dopant concentration being greater than said fifth dopant concentration of said fourth region, said sixth region being located within said fourth region; and
   a conductive plug region formed in said contact enhancement region and said body region of said semiconductor material.

2. The lateral RF MOS transistor structure of claim 1, wherein said conductive plug region connects said source region and said body region of said semiconductor material to a backside of said structure.

3. The lateral RF MOS transistor structure of claim 1, wherein said conductive plug region connects a top or lateral surface of said source and a lateral surface of said body region of said semiconductor material to a highly conductive substrate of said structure.

4. The lateral RF MOS transistor structure of claim 1, wherein said first conductivity type is a P type.

5. The lateral RF MOS transistor structure of claim 1, wherein said conductive plug comprises a metal plug.

6. The lateral RF MOS transistor structure of claim 1, wherein said conductive plug comprises a silicided plug.

7. The lateral RF MOS transistor structure of claim 6, wherein said silicided plug comprises a tungsten silicided plug.

8. The lateral RF MOS transistor structure of claim 6, wherein said silicided plug comprises a titanium silicided plug.

9. The lateral RF MOS transistor structure of claim 6, wherein said silicided plug comprises a cobalt silicided plug.

10. The lateral RF MOS transistor structure of claim 6, wherein said silicided plug comprises a platinum silicided plug.

* * * * *